United States Patent [19]

Maehata et al.

[11] Patent Number: 5,571,365
[45] Date of Patent: Nov. 5, 1996

[54] ADHESIVE FOR PRINTED CIRCUIT BOARD

[75] Inventors: Eiji Maehata, Tokyo; Toshio Komiyatani, Fujieda, both of Japan

[73] Assignees: Nec Corporation; Sumitomo Bakelite Corporation Limited, both of Tokyo, Japan

[21] Appl. No.: 340,327

[22] Filed: Nov. 14, 1994

[30] Foreign Application Priority Data

Nov. 26, 1993 [JP] Japan .................................. 5-296976

[51] Int. Cl.⁶ .................................................. C09J 163/00
[52] U.S. Cl. .......................... 156/326; 156/330; 174/258; 174/259
[58] Field of Search ..................... 156/326, 330, 156/272.2, 275.5; 174/258, 259

[56] References Cited

U.S. PATENT DOCUMENTS

| 4,601,784 | 7/1986 | Krulik . |
|---|---|---|
| 4,752,499 | 6/1988 | Enomoto . |
| 4,948,630 | 8/1990 | Courduvelis et al. . |
| 5,021,472 | 6/1991 | Enomoto . |
| 5,055,321 | 10/1991 | Enomoto et al. . |
| 5,212,261 | 5/1993 | Stierman . |
| 5,344,893 | 9/1994 | Asai et al. . |
| 5,418,264 | 5/1995 | Obloh et al. . |
| 5,447,996 | 9/1995 | Asai et al. . |
| 5,519,177 | 5/1996 | Wang et al. . |

Primary Examiner—David A. Simmons
Assistant Examiner—Steven J. Helmer
Attorney, Agent, or Firm—Browdy and Neimark

[57] ABSTRACT

An adhesive for a printed circuit board which consists essentially of a dispersion of a resin which is soluble in an alkaline oxidizing agent after curing in a resin matrix which is sparingly soluble in an alkaline oxidizing agent after curing, and a process for producing a printed circuit board using the above adhesive.

14 Claims, 1 Drawing Sheet

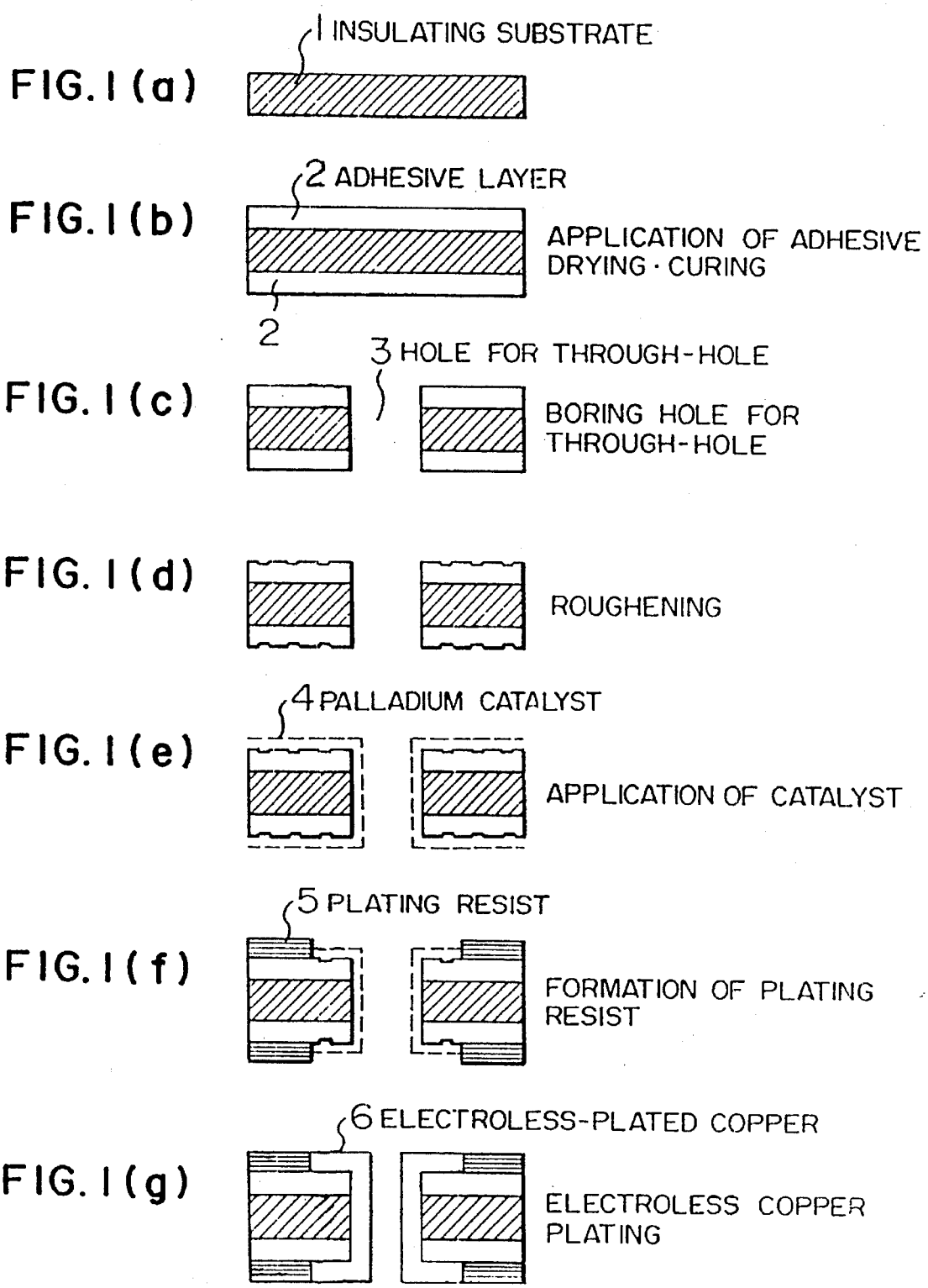

ADHESIVE FOR PRINTED CIRCUIT BOARD

BACKGROUND OF THE INVENTION

1. Field of the Invention

This invention relates to an adhesive for a printed circuit board and to a process for producing a printed circuit board using the adhesive.

2. Related Art Statement

It is known that in a process for producing a printed circuit board comprising forming an adhesive layer on the surface of a laminate consisting of insulating substrates and then forming a circuit and through-holes there by electroless plating, the adhesive layer is roughened with an oxidizing agent in order to enhance the adhesion between the plated circuit and the adhesive layer. As disclosed in Japanese Patent Application Kokoku No. 63-10,752; Japanese Patent Application Kokai No. 63-297,571; Japanese Patent Application Kokai No. 64-47,095; Japanese Patent Application Kokai No. 3-18,096 and the like, almost all adhesives contain a rubber component such as acrylonitrile-butadiene rubber or the like, and an aqueous chromic acid-sulfuric acid solution is used as the oxidizing agent, and the roughening of the surface of the adhesive layer is effected by dissolving the rubber component.

However, the adhesive containing a rubber component is low in reliability of heat resistance, electrical insulation properties, metal-migration resistance, etc., and there is a problem when it is applied to a printed circuit board requiring a high reliability and a printed circuit board having a high density plated circuit.

There are also some other methods of roughening the adhesive layer such as a method in which a dispersion of an inorganic fine powder such as silica, calcium carbonate or the like in a resin matrix having excellent heat resistance such as an epoxy resin, a phenol resin, a melamine resin or the like is used as an adhesive and the inorganic fine powder in the adhesive is selectively dissolved in a specific chemical; a method as described in Japanese Patent Application Kokai No. 1-29,479 which comprises dispersing, in an epoxy resin matrix, a cured epoxy resin fine powder having a different solubility in an oxidizing agent from the solubility of the epoxy resin matrix in the oxidizing agent and selectively dissolving the cured epoxy resin fine powder in the oxidizing agent; and the like.

However, in the above-mentioned methods, it is necessary to uniformly disperse, in an adhesive varnish, a fine powder (having a particle size of an order of several microns) in such an amount as to obtain a satisfactory roughening effect in order to obtain a good dimension precision, and this is technically difficult.

In the above methods, a strong oxidizing agent such as aqueous chromic acid-sulfuric acid solution is used in cases other than the case in which the fine inorganic powder is selectively dissolved off in the specific chemical, so that there are severe problems in respect of working atmosphere, safety and health. Moreover, there are such problems that when the adhesive layer formed on a substrate through which holes for forming plated through-holes have been bored is toughened, excessive roughened surface is formed on the inner walls of the holes, and hence, the connection reliability of the plated through-holes is lowered; and the electroless plating solution is apt to permeate the substrate along the glass cloth, and the insulation reliability between the plated through-holes is also greatly lowered.

As a method of solving the above problems, as stated in Japanese Patent Application Kokoku No. 5-4,840, it has been proposed to cover the surface of a substrate having a toughened adhesive layer with a protective mask and then bore holes for forming plated through-holes.

However, the steps of covering with the protective mask and removing the protective mask are increased, and furthermore close attention must be paid so as to keep the roughened shapes formed in the adhesive layer in the state just after the roughening treatment.

Thus, in the conventional adhesives for printed circuit board and the conventional processes for producing a printed circuit board using the said adhesives, there are such problems that in the case of an adhesive containing a rubber component, the reliability of the resulting printed circuit board is lowered, that in the case of an adhesive comprising a resin matrix in which a fine powder to be selectively dissolved in an oxidizing agent is dispersed, it is very difficult to produce the fine powder with good precision and disperse the same uniformly, that since an aqueous chromic acid-sulfuric acid solution is used as the oxidizing agent for roughening the adhesive layer, working atmosphere, safety and health are greatly deteriorated, and that when a multilayer substrate through which holes for forming plated through-holes have been bored is roughened, the inner walls of the holes are also roughened, and hence the reliability of the plated through-holes is lowered.

OBJECT AND SUMMARY OF THE INVENTION

It is an object of this invention to solve the above various problems.

It is another object of this invention to provide an adhesive for a printed circuit board free from the above problems.

It is still another object of this invention to provide a process for producing a printed circuit board using the above adhesive.

Other objects and advantages of this invention will become apparent from the following description and the accompanying drawings.

According to this invention, there is provided an adhesive for a printed circuit board, which comprises a resin matrix which is, after curing, sparingly soluble in an alkaline oxidizing agent, having dispersed therein molecular chains of a resin which is, after curing, soluble in the alkaline oxidizing agent such as a bisphenol A epoxy resin having an epoxy equivalent of 2,000 or more.

According to this invention, there is further provided a process for producing a printed circuit board, which comprises forming an adhesive layer on a substrate by coating the substrate with the above-mentioned adhesive and curing the same with ultraviolet rays and/or heat or by forming an adhesive film from the above-mentioned adhesive, laminating the adhesive film onto the substrate and then curing the adhesive with ultraviolet rays and/or heat; then dissolving off in the alkaline oxidizing agent the resin molecular chains or strands which are soluble in the alkaline oxidizing agent and are dispersed in the adhesive layer, thereby roughening the adhesive layer surface; and thereafter subjecting the resulting assembly to electroless plating.

BRIEF DESCRIPTION OF THE DRAWINGS

FIG. 1 (a) to FIG. 1 (g) are outlined sectional views showing the process for the production of a multilayer printed circuit board by an additive process based on this invention. In these figures, numerals 1 to 6 have the following meanings:
1—Insulating substrate
2—Adhesive layer
3—Hole for through-hole
4—Palladium catalyst
5—Plating resist
6—Electroless plated copper

DETAILED DESCRIPTION OF THE INVENTION

This invention makes it possible to roughen the adhesive layer formed on the surface of a substrate with an alkaline oxidizing agent such as an alkaline aqueous permanganate solution or the like in the process for producing a printed circuit board by an additive process.

That is to say, in this invention, the molecule strands or chains of the specific resin component in the adhesive components which are at the surface are selectively dissolved in an alkaline oxidizing agent to roughen the surface of the adhesive layer. In this case, it is considered that the resin to be selectively dissolved would be microscopically phase-separated from the resin constituting the matrix of the adhesive to form a sea-island structure in which the matrix resin is the sea, and the island resin would be selectively dissolved.

The alkaline oxidizing agent includes alkaline aqueous solutions of potassium permanganate, sodium permanganate, potassium persulfate, sodium persulfate, potassium chlorate, sodium chlorate and the like. Among them, alkaline aqueous solutions of potassium permanganate and sodium permanganate are preferred in view of oxidation intensity and easy handling.

Representative examples of the resin component to be dissolved in the alkaline oxidizing agent include bisphenol A epoxy resins having a high molecular weight and an epoxy equivalent of 2,000 or more. The resin to be dissolved in the alkaline oxidizing agent is particularly preferably the bisphenol A epoxy resin having an epoxy equivalent of 2,000 or more. However, these epoxy resins which have been brominated and phenoxy resins having a very high molecular weight can also be used.

Incidentally, such bisphenol A epoxy resins are required to have an epoxy equivalent of 2,000 or more, forming substantially non-crosslinked molecule strands of chains; and when the epoxy equivalent is less than 2,000, the cross-linking density of the epoxy resin becomes high so that the toughening with the alkaline oxidizing agent becomes difficult.

Bisphenol A epoxy resins having an epoxy equivalent of 2,000 or more are present in molecular chain or strand form, which strands or chains are excellent in uniform dispersion in the resin matrix of the adhesive and form micro separated phases, so that uniformly and finely roughened adhesive layer is formed after a portion of the above epoxy resin molecular strands or chains have been dissolved off in the alkaline oxidizing agent.

The resin constituting the resin matrix is sparingly soluble in the alkaline oxidizing agent after the resin has been cured. That is to say, the resin has a high reaction site density and hence after the resin has been cured the cross-linking density becomes high. As a result thereof, the resin matrix is excellent in chemical resistance and only at most sparingly soluble, i.e. substantially insoluble, in the alkaline oxidizing agent. The resin includes specifically epoxy resins having an epoxy equivalent of 400 or less, acrylic group-containing resins and acrylic resins.

The process for producing a printed circuit board of this invention is explained below.

An adhesive layer 2 is formed on the surface (one side or both sides) of an insulating substrate 1. In this case, the insulating substrate may be a conventional one and there can be used a glass-epoxy resin laminate, a glass-polyimide resin laminate, a glass-polyester resin laminate, a paper-phenol resin laminate, a ceramic board or the like. The materials for the substrate are those hardly soluble in the alkaline oxidizing agent, so that the holes 3 for through-holes formed in the substrate are not excessively roughened.

In the formation of the adhesive layer 2, an adhesive varnish prepared by dissolving the adhesive components in the desired solvent at the desired concentration may be directly applied to the surface of the insulating substrate 1, dried and then cured; or alternatively, a film-like adhesive prepared by previously coating the adhesive varnish on a carrier film and drying the adhesive varnish may be laminated to the insulating substrate 1 and then cured.

The adhesive may, if necessary, further contain a finely divided filler such as silica or the like and an additive such as a coupling agent, a stabilizer or the like. The thickness of the adhesive layer 2 is preferably 15 to 30 μm.

The adhesive layer 2 consists of an adhesive which is a mixture of a matrix resin which is sparingly soluble in the alkaline oxidizing agent, the molecule strands or chains of a resin which is soluble in the alkaline oxidizing agent and, if necessary, a curing agent. Holes 3 for plated through-holes are bored through the laminate of the adhesive layer on the substrate, and thereafter, the surface of the adhesive layer 2 is roughened with the alkaline oxidizing agent. Subsequently, a palladium catalyst 4 is applied to the roughened surface of the adhesive layer, the laminate is then subjected to patterning with a plating resist 5 and thereafter to electroless copper plating to form a circuit and plated through-holes 6.

As stated above, in this invention, a printed circuit board is produced by an additive process which comprises forming an adhesive layer on a substrate and forming there a plated circuit and plated through-holes by electroless plating. Since the adhesive layer can be roughened with an alkaline oxidizing agent such as an alkaline aqueous potassium permanganate solution or the like, an improvement in respect of working atmosphere, safety and sanitation can be accomplished as compared with roughening with an aqueous chromic acid-sulfuric acid solution. Also, by the additive plating method the printed circuit board can be produced without impairing the reliability of the plated through-holes.

The adhesive of this invention can be prepared by a very simple method that uncured resins are blended, and fine concaves in the order of submicrons to several microns can be formed throughout the adhesive layer surface with an alkaline oxidizing agent.

DESCRIPTION OF THE PREFERRED EMBODIMENTS

This invention is explained in more detail below referring to Examples. In these Examples multilayer printed circuit boards were produced by an additive plating process. In the Examples, all parts and % are by weight unless otherwise specified.

Example 1

In 200 parts of methyl ethyl ketone were dissolved with stirring 100 parts of a bisphenol F epoxy resin (EPICLON 830, a trade name of DAINIPPON INK & CHEMICALS, INC., epoxy equivalent: 175) and 50 parts of a bisphenol A epoxy resin (Epikote 1010, a trade name of Yuka-Shell Epoxy Co., Ltd., epoxy equivalent: 3,000 to 4,000).

To the solution were added 10 parts of dicyandiamide as a curing agent, 10% solution of 1 part of 2-ethyl- 4-methylimidazole as a curing accelerator in methyl Cellosolve acetate and 3 parts of a silane coupling agent (A-187, a trade name of Nippon Unicar K. K.) to prepare an adhesive varnish.

Subsequently, the adhesive varnish was applied on both surfaces of a glass-epoxy resin multilayer substrate so that the thickness after drying became 30 μm by a roll coater and then dried. Subsequently, the adhesive varnish was heat-cured at 180° C. for 60 minutes, and thereafter, holes having a diameter of 0.4 mm for plated through-holes were bored through the laminate of the adhesive layers on the multilayer substrate.

Subsequently, the laminate was immersed in an aqueous sodium hydroxide solution at 80° C. for ten minutes to subject the adhesive layers to degreasing and swelling treatment, then subjected to roughening with an alkaline aqueous potassium permanganate solution at 70° C. for ten minutes, sufficiently washed with water and then immersed in an aqueous hydroxylamine sulfate solution at 50° C. for ten minutes to neutralize and remove the permanganate remaining in the adhesive layers.

Thereafter, the laminate was immersed in an aqueous alkali degreasing solution comprising sodium carbonate as a main component at 75° C. for five minutes, washed with water sufficiently and then immersed in a palladium-tin complex colloidal catalyst solution for five minutes. After water-washing, the laminate was immersed in a catalyst-activating bath at room temperature for eight minutes to activate palladium-tin complex colloidal particles adhered to the surface of the adhesive layer.

Subsequently, a plating resist for the desired plated circuit and the desired plated through-holes was formed by a known method.

Thereafter, the laminate was immersed in an electroless copper plating solution at 70° C. for ten hours to form an electroless plated copper circuit having a thickness of about 20 μm on the surface of the multilayer substrate, thereby producing a multilayer printed circuit board by the additive process.

Example 2

The same procedure as in Example 1 was repeated, except that the amount of the bisphenol A epoxy resin having an epoxy equivalent of 3,000 to 4,000 was changed to 20 parts, to prepare a multilayer printed circuit board by the additive process.

Example 3

The same procedure as in Example 1 was repeated, except that 100 parts of a bisphenol A novolac epoxy resin (EPI-CLON N-865, a trade name of DAINIPPON INK & CHEMICALS, INC., epoxy equivalent: 205) was substituted for the bisphenol F epoxy resin, to prepare a multilayer printed circuit board by the additive process.

Example 4

In place of the adhesive in Example 1, a photosetting adhesive was prepared which consisted of 50 parts of a bisphenol A epoxy resin (Epikote 1010 of Yuka-Shell Epoxy K. K., epoxy equivalent: 3,000 to 4,000), 38 parts of an epoxy acrylate (KAYARAD R-167, a trade name of NIPPON KAYAKU CO., LTD.), 54 parts of nonylphenoxy polypropylene glycol acrylate (ARONIX M-117, a trade name of TOAGOSEI CHEMICAL INDUSTRY CO., LTD.), 2 parts of benzyl dimethyl ketal (Irgacure 651, a trade name of CIBA-GEIGY) as a photoinitiator, 2 parts of benzophenone and 3 parts of N-methylethanolamine as a polymerization inhibitor, and passed at a speed of 8 m/min under an ultraviolet ray lamp of 80 W/cm to be cured. Subsequently, in the same manner as in Example 1, a multilayer printed circuit board was prepared by the additive process.

Example 5

The same adhesive as used in Example 1 was applied to both surfaces of a glass epoxy resin multilayer substrate by a roll coater so that the thickness after drying became 30 μm, dried and heat-cured, and thereafter, holes having a diameter of 0.4 mm for plated through-holes were bored through the resulting laminate of the adhesive layers on the substrate, after which the adhesive layer was ground off about 3 μm by means of a surface grinder corresponding to #800 roughness.

Subsequently, the degreasing and swelling treatments and the subsequent treatments were conducted in the same manner as in Example 1 to prepare a multilayer printed circuit board by the additive process.

The printed circuit boards thus obtained had characteristics as shown in Table 1.

TABLE 1

| Example No. | Pealing strength of plated copper (KN/m) | Insulation resistance (Ω) Normal state | Insulation resistance (Ω) After boiling test | Solder heat resistance |
| --- | --- | --- | --- | --- |
| 1 | 2.0 | $10^{12}$ | $10^{11}$ | o |
| 2 | 1.6 | $10^{12}$ | $10^{11}$ | o |
| 3 | 1.9 | $10^{12}$ | $10^{11}$ | o |
| 4 | 1.8 | $10^{12}$ | $10^{11}$ | o |
| 5 | 2.0 | $10^{12}$ | $10^{11}$ | o |

Note:
Pealing strength and insulation resistance were measured according to JIS C6891. Boiling test conditions: 100° C., 2 hrs Solder heat resistance: "o" means the case where none of 5 samples caused blister in the treatment at 260° C. for 20 sec.

What is claimed is:

1. An adhesive for a printed circuit board which consists essentially of a dispersion of (1) molecules of a bis-phenol A epoxy resin having an epoxy equivalent of 2,000 or more or of a phenoxy resin as a resin which is soluble in an alkaline oxidizing agent after curing, in (2) a resin matrix which is sparingly soluble in the alkaline oxidizing agent after curing.

2. The adhesive for a printed circuit board according to claim 1, wherein the resin which is soluble in the alkaline oxidizing agent after curing is said bisphenol A epoxy resin having an epoxy equivalent of 2,000 or more.

3. The adhesive for a printed circuit board according to claim 1, wherein the bisphenol A epoxy resin having an epoxy equivalent of 2,000 or more or the phenoxy resin is contained in an amount of 20 to 50% by weight.

4. The adhesive for a printed circuit board according to claim 1, wherein the resin matrix which is sparingly soluble in the alkaline oxidizing agent after curing consists of an epoxy resin having an epoxy equivalent of 400 or less, or a resin having an acrylic group.

5. A process for producing a printed circuit board which comprises applying the adhesive according to claim 1 onto a substrate, curing the adhesive with ultraviolet rays, heat or a combination of the two to form an adhesive layer, dissolving off in an alkaline oxidizing agent the resin portions which are dispersed in the adhesive layer and which are soluble in the alkaline oxidizing agent to roughen the adhesive layer surface and then subjecting the resulting laminate of the adhesive layer on the substrate to electroless plating.

6. A process for producing a printed circuit board which comprises forming an adhesive film from the adhesive according to claim 1, laminating the adhesive film onto a substrate, curing the adhesive with ultraviolet rays, heat or a combination of the two to form an adhesive layer, dissolving off in an alkaline oxidizing agent the resin portions which are dispersed in the adhesive layer and which are soluble in the alkaline oxidizing agent to roughen the adhesive layer surface, and then subjecting the resulting laminate of the adhesive layer on the substrate to electroless plating.

7. The process for producing a printed circuit board according to claim 5, wherein the resin which is soluble in the alkaline oxidizing agent after curing is a bisphenol A epoxy resin having an epoxy equivalent of 2,000 or more.

8. The process for producing a printed circuit board according to claim 7, wherein the bisphenol A epoxy resin is present in an amount of 20–50% by weight.

9. The process for producing a printed circuit board according to claim 5, wherein the resin matrix consists of an epoxy resin having an epoxy equivalent of 400 or less, or a resin having an acrylic group.

10. The process for producing a printed circuit board according to claim 6, wherein the resin which is soluble in the alkaline oxidizing agent after curing is a bisphenol A epoxy resin having an epoxy equivalent of 2,000 or more.

11. The process for producing a printed circuit board according to claim 10, wherein the bisphenol A epoxy resin is present in an amount of 20–50% by weight.

12. The process for producing a printed circuit board according to claim 6, wherein the resin matrix consists of an epoxy resin having an epoxy equivalent of 400 or less, or a resin having an acrylic group.

13. A substrate for a printed circuit having thereon a cured and roughened upper layer for receiving and adhering thereto an electroless plating, said cured and roughened upper layer being formed by applying an adhesive film onto said substrate and curing said adhesive film, said adhesive film consisting essentially of (1) 20–50% by weight of resin chains of a resin which is soluble in an alkaline oxidizing agent and which is selected from the group consisting of a bisphenol A epoxy resin having an epoxy equivalent of at least 2,000, and a high molecular weight phenoxy resin, dispersed in (2) 80–50% by weight of a resin matrix which is substantially insoluble in the alkaline oxidizing agent after curing, and applying an alkaline oxidizing agent to said cured adhesive film to dissolve chains of said resin which is soluble in said alkaline oxidizing agent and to roughen the adhesive film.

14. A coated substrate for a printed circuit board according to claim 13 wherein said resin matrix which is substantially insoluble in the alkaline oxidizing agent after curing is an epoxy resin having an epoxy equivalent of 400 or less, or a resin having an acrylic group.

* * * * *